US012438016B2

United States Patent
Kinoshita et al.

(10) Patent No.: US 12,438,016 B2
(45) Date of Patent: Oct. 7, 2025

(54) OBJECTS DETECTING METHOD FOR VACUUM PROCESSING APPARATUS

(71) Applicant: Hitachi High-Tech Corporation, Tokyo (JP)

(72) Inventors: Takaharu Kinoshita, Tokyo (JP);
Hisanori Hayano, Tokyo (JP);
Tomoyuki Watanabe, Tokyo (JP);
Norifumi Ozaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 484 days.

(21) Appl. No.: 17/439,738

(22) PCT Filed: Sep. 18, 2020

(86) PCT No.: PCT/JP2020/035381
§ 371 (c)(1),
(2) Date: Sep. 15, 2021

(87) PCT Pub. No.: WO2022/059158
PCT Pub. Date: Mar. 24, 2022

(65) Prior Publication Data
US 2022/0310422 A1     Sep. 29, 2022

(51) Int. Cl.
*H01L 21/67*     (2006.01)
*H01L 21/683*    (2006.01)

(52) U.S. Cl.
CPC .. *H01L 21/67196* (2013.01); *H01L 21/67253* (2013.01); *H01L 21/6838* (2013.01)

(58) Field of Classification Search
None
See application file for complete search history.

(56) References Cited

U.S. PATENT DOCUMENTS

2004/0149208 A1   8/2004  Shiraishi et al.
2007/0196011 A1*  8/2007  Cox ................. H01L 21/67167
                                                      382/145
(Continued)

FOREIGN PATENT DOCUMENTS

JP    H09326023 A    12/1997
JP    2004241499 A    8/2004
(Continued)

OTHER PUBLICATIONS

Search Report mailed Dec. 1, 2020 in International Application No. PCT/JP2020/035381.
(Continued)

*Primary Examiner* — Dale E Page
*Assistant Examiner* — Derek L Nielsen
(74) *Attorney, Agent, or Firm* — Miles & Stockbridge, P.C.

(57) ABSTRACT

An objects detecting method for a vacuum processing apparatus equipped with: a processing unit including a vacuum container having therein a processing chamber in which a wafer is processed, and an exhaust pump that exhausts gas in the processing chamber; a vacuum transfer unit including a transfer chamber in which the wafer is transferred; and a connection pipe including a passage through which the wafer can be transferred between the processing chamber and the transfer chamber, includes: an objects collecting process of increasing an internal pressure of the transfer chamber to be higher than an internal pressure of the processing chamber to generate a gas flow in the passage from the transfer chamber toward the processing chamber, transferring the wafer to a position straddling the transfer chamber, the passage, and the processing chamber, and holding the wafer for a predetermined time; and an objects
(Continued)

detecting process of detecting objects adhering to a surface of the wafer.

5 Claims, 7 Drawing Sheets

(56) References Cited

U.S. PATENT DOCUMENTS

| | | | |
|---|---|---|---|
| 2008/0213082 A1* | 9/2008 | Kato | H01L 21/67253 |
| | | | 414/805 |
| 2015/0371817 A1* | 12/2015 | Ando | H01J 37/265 |
| | | | 250/442.11 |
| 2016/0307784 A1 | 10/2016 | Gomi et al. | |

FOREIGN PATENT DOCUMENTS

| | | | |
|---|---|---|---|
| JP | 2006261539 A | 9/2006 |
| JP | 2008192828 A | 8/2008 |
| JP | 2014146764 A | 8/2014 |
| JP | 2016207767 A | 12/2016 |
| JP | 2019071410 A | 5/2019 |

OTHER PUBLICATIONS

Written Opinion mailed Dec. 1, 2020 in International Application No. PCT/JP2020/035381.

\* cited by examiner

[FIG. 1]
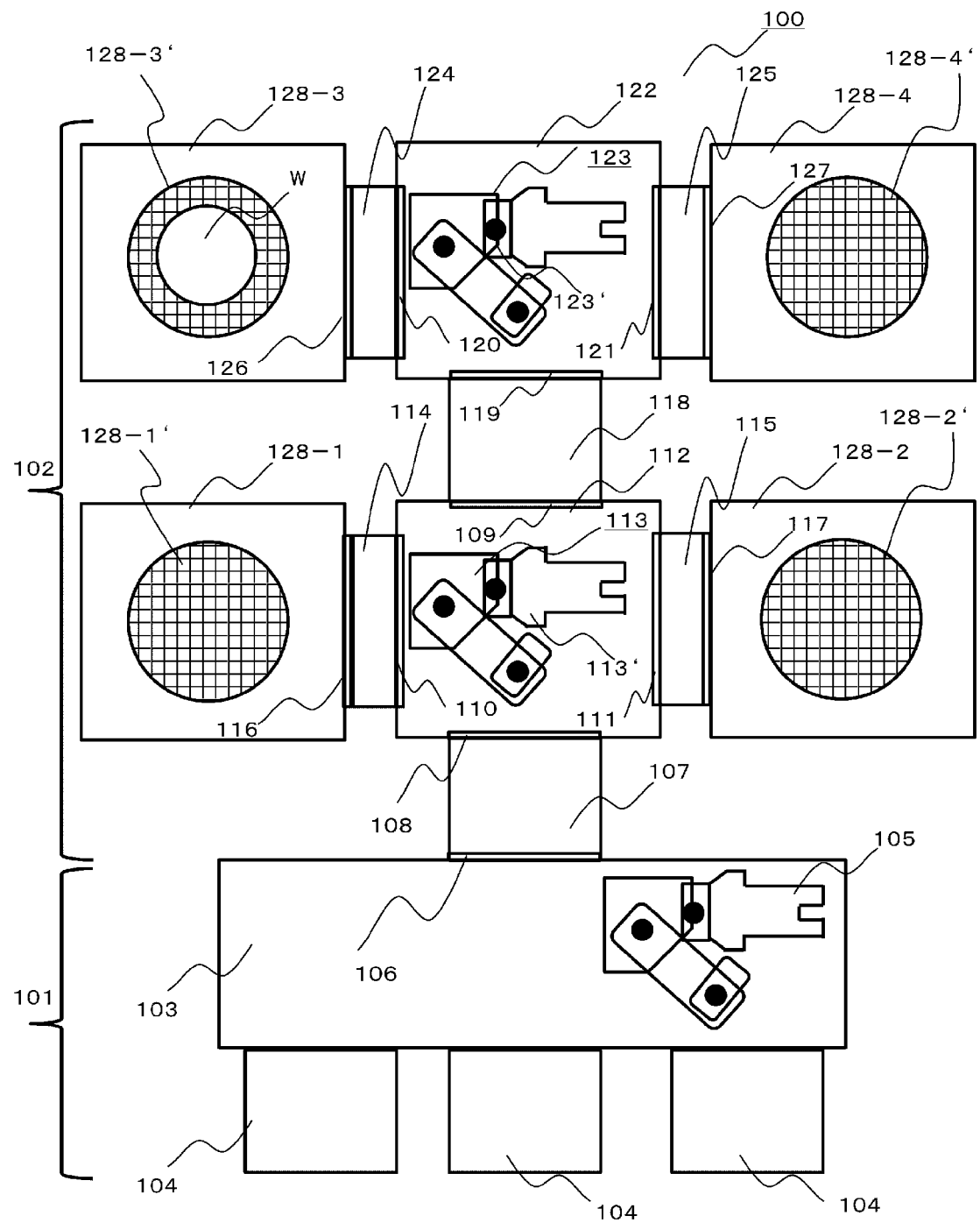

[FIG. 2]
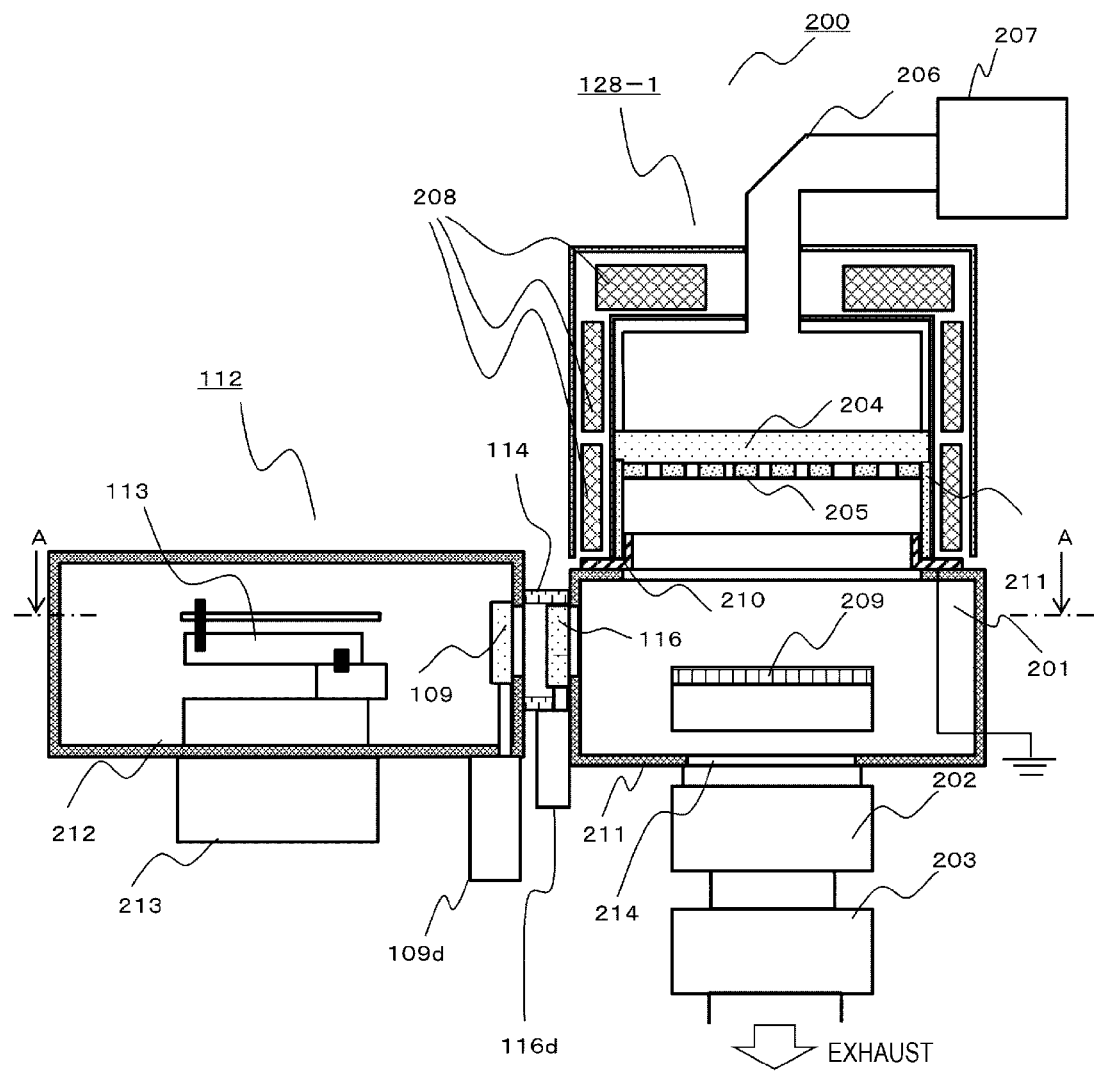

[FIG. 3]
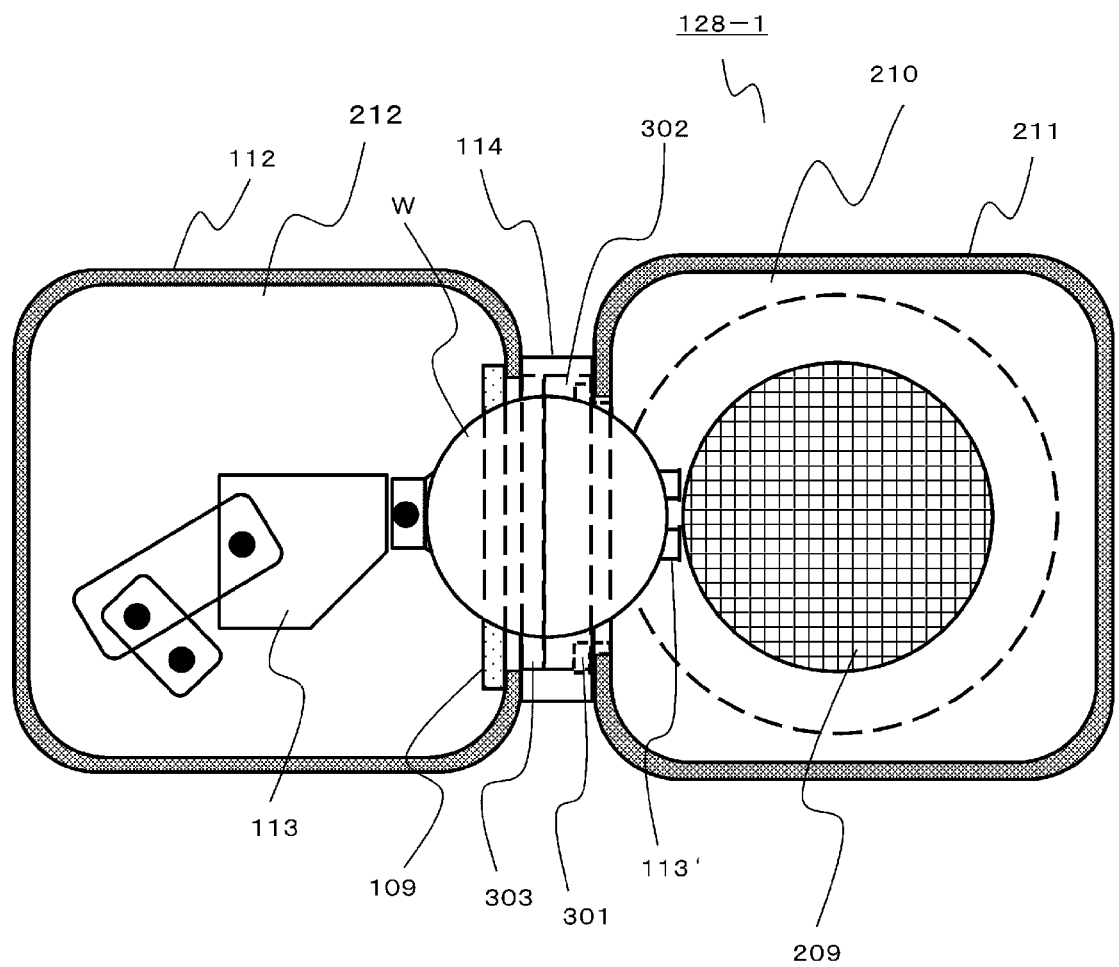

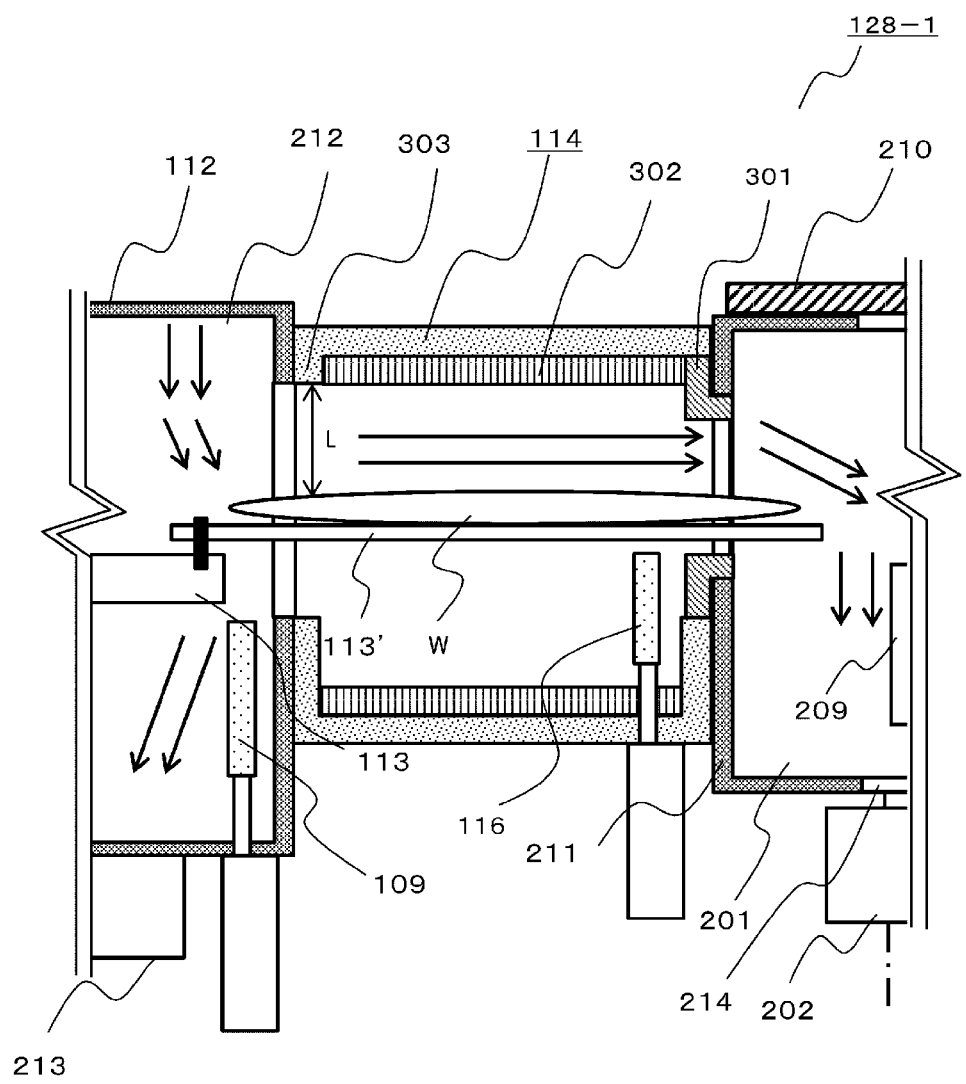
[FIG. 4]

[FIG. 5]
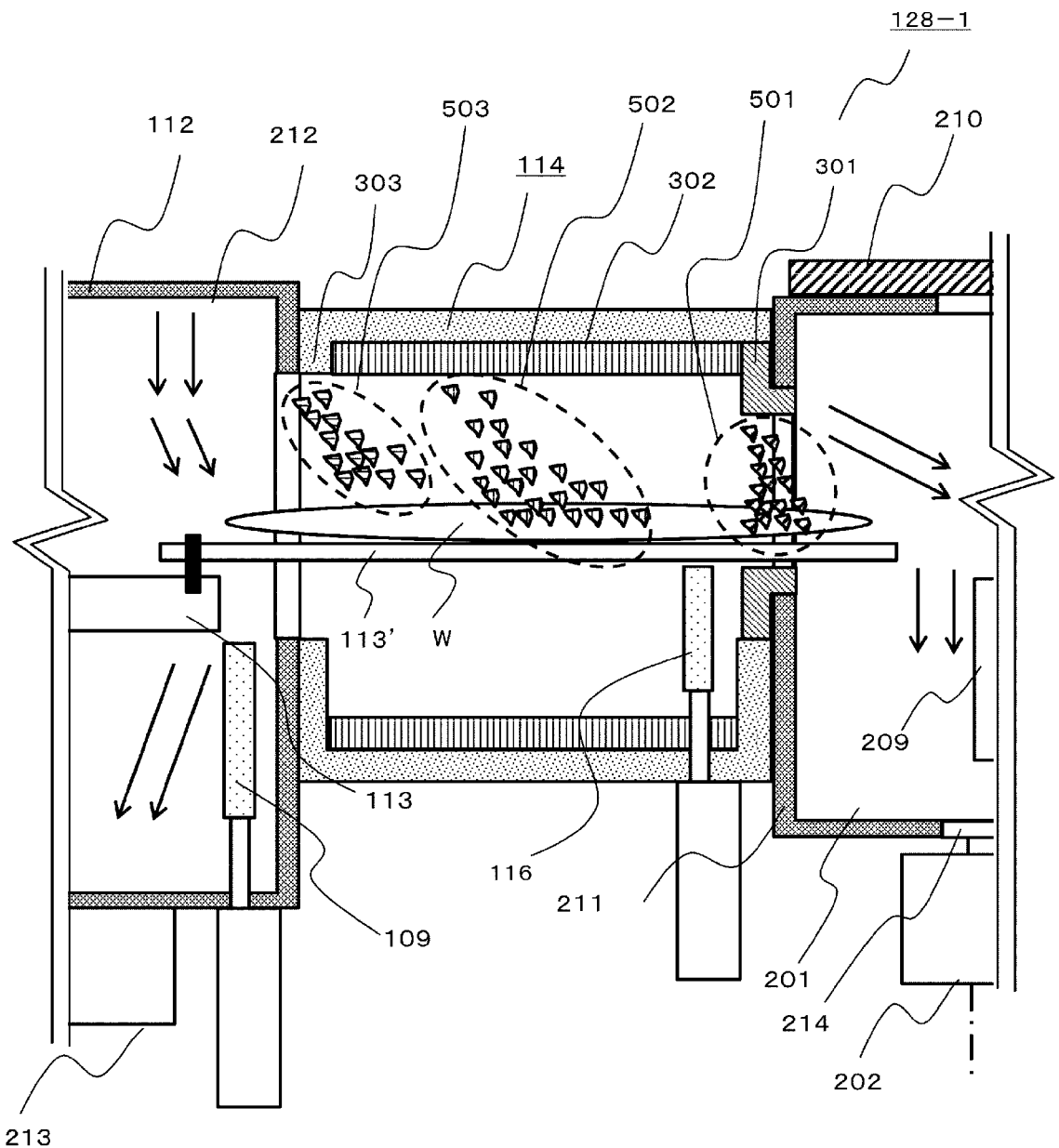

[FIG. 6]
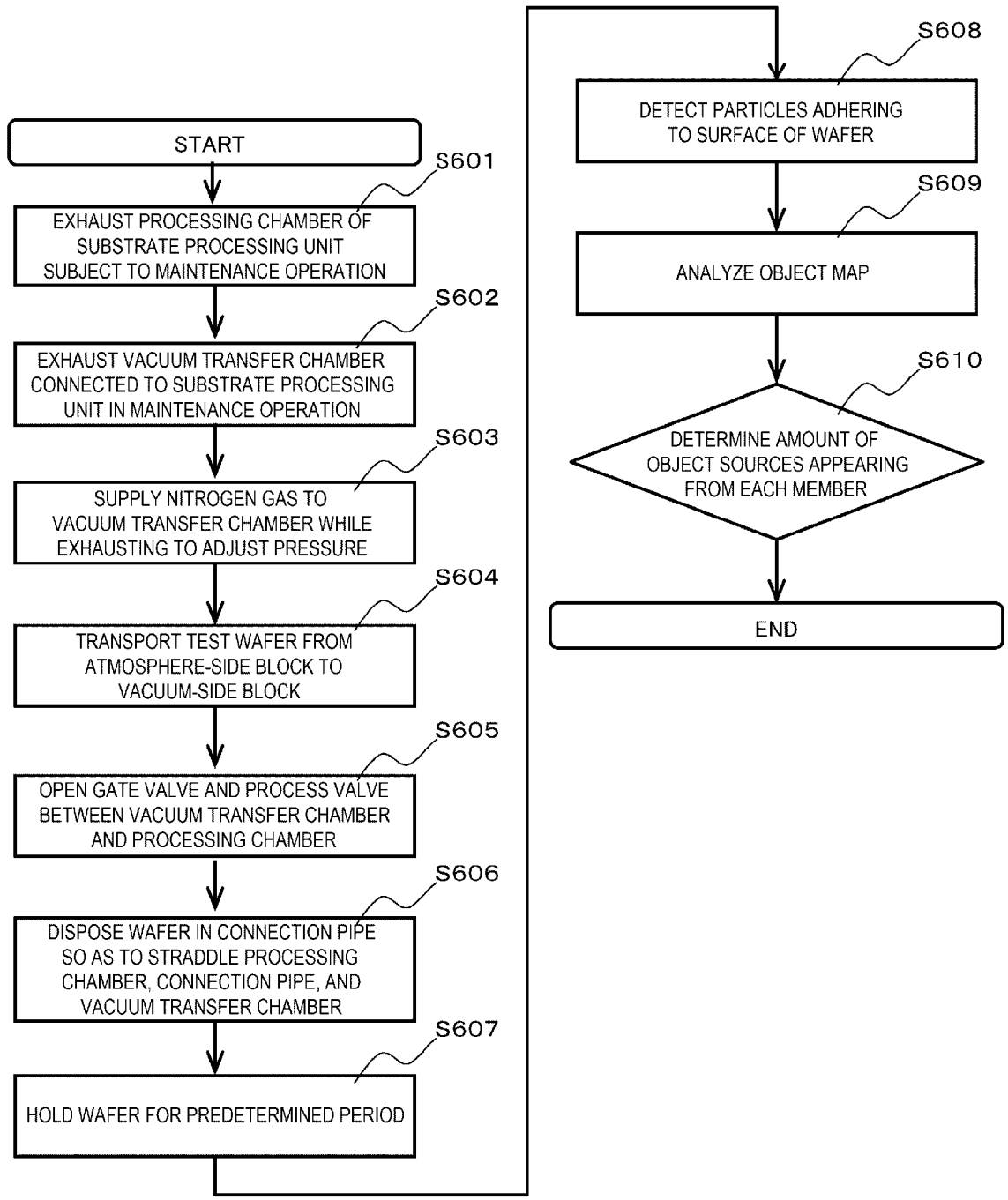

[FIG. 7]
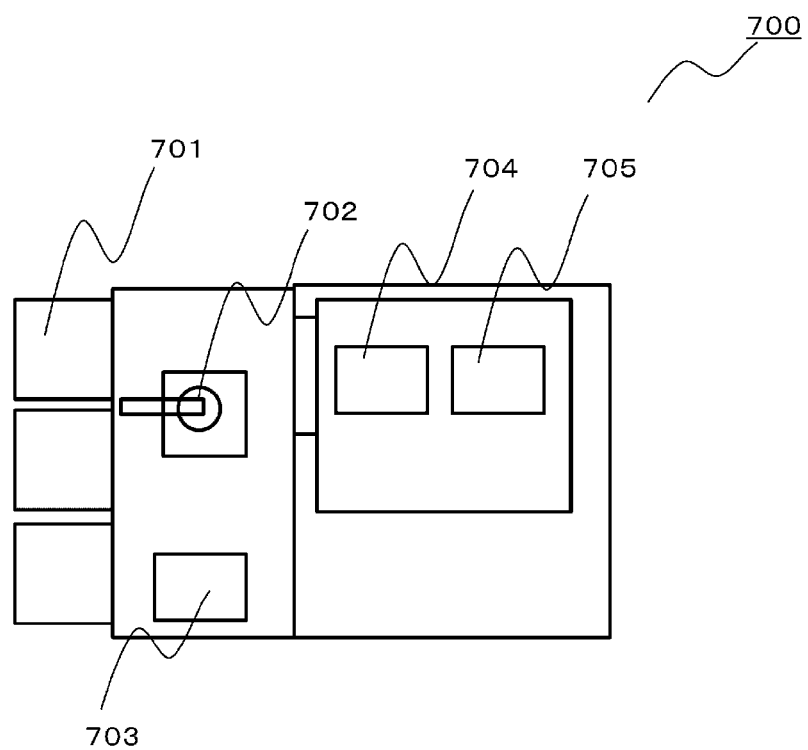

OBJECTS DETECTING METHOD FOR VACUUM PROCESSING APPARATUS

TECHNICAL FIELD

The present invention relates to an objects detecting method for a vacuum processing apparatus.

BACKGROUND ART

There has been a vacuum processing apparatus including a vacuum processing unit that has a decompressed processing chamber inside a vacuum container, and that transfers a substrate-like sample such as a semiconductor wafer into the processing chamber, and processes the sample using a plasma formed by introducing a processing gas. In the vacuum processing apparatus, the processing chamber inside the vacuum container of the vacuum processing unit is connected to a vacuum transfer container which is another vacuum container. The sample processed in the processing chamber passes through the vacuum transfer chamber inside the decompressed vacuum container, is transferred to the vacuum transfer container, and is transferred to a subsequent process. The sample before processing is transferred from the vacuum transfer container to the processing chamber inside the vacuum container through the vacuum transfer chamber.

In such a vacuum processing apparatus, since the sample is transferred between the processing chamber and the vacuum transfer chamber through a passage between them, there is a problem that particles and deposits thereof adhering to inner surfaces of the processing chamber and the vacuum transfer chamber are detached from surfaces and adhere to the surface of the sample during the transfer of the sample to generate objects. If the objects adhere to the surface of the sample, a defect may occur in a semiconductor device manufactured from a portion including an adhered portion, and yield in manufacturing the semiconductor device may be deteriorated.

Therefore, in order to prevent the occurrence of such objects, it has been performed in the related art to collect the particles detached from the inner surface of the vacuum processing apparatus and to detect characteristics such as the number, material, and composition of the particles. As an example of such prior art, for example, a technique disclosed in Patent Literature 1 has been known in the related art.

In this related art, a test wafer for adsorbing and collecting fine particles on a surface is transferred into a decompressed internal space of a vacuum processing apparatus exhausted by a dry pump, and left (subjected to sitting) at a predetermined position for a certain period of time. After the measurement wafer is collected, the number of fine particles such as particles adhering to the surface thereof is measured.

CITATION LIST

Patent Literature

PTL 1: JP-A-2019-71410

SUMMARY OF INVENTION

Technical Problem

However, the above-mentioned prior art has the following problems. That is, when only exhaustion is performed by a dry pump at the time of sitting, dispersion of molecules becomes close to a molecular flow, and the degree of dispersion increases. Accordingly, when object generation source candidates are concentrated at two or three places, falling objects adhere to the wafer while being dispersed, and thus it is difficult to specify object generation sources from places where the objects fall.

If the object generation sources cannot be specified, it is not possible to accurately perform maintenance operation such as cleaning or replacement of a member that is used inside the vacuum processing apparatus and faces a space in which the wafer is transferred, and in which particles or fragments of a substance adhering to the wafer may be generated. As a result, the objects may be attached to the processed wafer, and yield of the processing may be impaired.

An object of the invention is to provide an objects detecting method for a vacuum processing apparatus capable of accurately detecting object generation sources or generation of objects, so as to prevent the generation of the objects and improve the yield of processing.

Solution to Problem

To solve the above-mentioned problem, a typical objects detecting method for a vacuum processing apparatus of the invention is:

An objects detecting method for a vacuum processing apparatus equipped with a processing unit including a vacuum container having therein a processing chamber in which a wafer is processed, and an exhaust pump that exhausts gas in the processing chamber; a vacuum transfer unit including a vacuum transfer container having therein a transfer chamber in which the wafer is transferred; a connection pipe connecting the vacuum container and the vacuum transfer container therebetween; and a passage communicating between the processing chamber and the transfer chamber via an inside of the connection pipe and one or more flanges through which the wafer can be transferred between the processing chamber and the transfer chamber, an inner surface of the passage being constituted by a plurality of surface regions corresponding to a plurality of members constituting the passage comprising the connection pipe and the one or more flanges, the objects detecting method for a vacuum processing apparatus comprising:

an objects collecting process of increasing an internal pressure of the transfer chamber to be higher than an internal pressure of the processing chamber to generate a gas flow in the passage along a direction from the transfer chamber toward the processing chamber, transferring the wafer in the gas flow along the direction to a position where a projection surface of the wafer overlaps simultaneously an inside of each of the transfer chamber and the passage and the processing chamber, and stopping the transfer at the position while holding the wafer at the position for a predetermined time and, while the transfer is stopped, collecting the objects which fall to adhere to a surface of the wafer position where the projection surface of the wafer overlaps simultaneously the inside of each of the transfer chamber and the passage and the processing chamber; and an objects detecting process of detecting objects adhering to each of a plurality of regions of the surface of the wafer, each region of the surface of the wafer being associated with a different corresponding one of the plurality of the surface regions of the inner surface of the plurality of members constituting the passage comprising the connection pipe and the one or more flanges, and determining whether the result of the detecting objects is within an allowable range for each region.

Advantageous Effect

The invention can provide an objects detecting method for a vacuum processing apparatus capable of accurately detecting object generation sources or generation of objects, so as to prevent the generation of the objects, and improve the yield of processing. Problems, configurations, and effects other than those described above will become apparent from the following description of embodiments.

BRIEF DESCRIPTION OF DRAWINGS

FIG. 1 is a plan view schematically showing an outline of an overall configuration of a semiconductor manufacturing apparatus according to an embodiment of the invention.

FIG. 2 is a vertical sectional view schematically showing an outline of a configuration of a substrate processing unit of the semiconductor manufacturing apparatus according to the embodiment shown in FIG. 1.

FIG. 3 is a horizontal sectional view schematically showing a state in which objects are collected during maintenance or inspection performed on the semiconductor manufacturing apparatus shown in FIG. 1.

FIG. 4 is a vertical sectional view schematically showing gas flows around a wafer in object detection performed by the semiconductor manufacturing apparatus according to the embodiment shown in FIG. 1.

FIG. 5 is a vertical sectional view schematically showing a state of particles or the like attached during detection of the objects shown in FIG. 4.

FIG. 6 is a flowchart showing a flow of a procedure of collecting and detecting objects from the wafer performed during a maintenance operation of the vacuum processing apparatus according to the embodiment shown in FIG. 1.

FIG. 7 is a plan view schematically showing an outline of an objects detecting device for detecting objects on a surface of a wafer W used for detecting the objects in the embodiment shown in FIG. 6.

DESCRIPTION OF EMBODIMENTS

Hereinafter, the description of embodiments will be described with reference to drawings. In addition, in the present description and the drawings, configurations denoted by the same reference numerals have substantially the same configuration, and redundant descriptions will be omitted.

First Embodiment

Hereinafter, an embodiment of the invention will be described with reference to FIGS. 1-7.

First, an overall configuration of a semiconductor manufacturing apparatus 100 according to the embodiment of the invention will be described with reference to FIG. 1. FIG. 1 is a plan view schematically showing an outline of the overall configuration of the semiconductor manufacturing apparatus according to the embodiment of the invention.

Here, a semiconductor wafer as a sample to be processed includes a wafer to be processed for manufacturing a semiconductor device and a wafer to be used for collecting objects in a substrate processing unit. Such a semiconductor wafer is referred to as a wafer W.

The semiconductor manufacturing apparatus 100 shown in FIG. 1 is an example of a vacuum processing apparatus, which is a so-called multi-chamber type apparatus, and includes a plurality of substrate processing units each having one processing chamber in which the wafer W as a substrate-like sample to be processed is disposed inside a vacuum container, and vacuum containers connected to the substrate processing units and each having one vacuum transfer chamber. The semiconductor manufacturing apparatus 100 may be a single-chamber type.

In FIG. 1, each of a first vacuum transfer unit 112, a second vacuum transfer unit 122, and substrate processing units 128-1 to 128-4 is one unit constituting the semiconductor manufacturing apparatus 100 including the vacuum containers. In the following description, the four substrate processing units 128-1 to 128-4 shown in FIG. 1 may be simply referred to as substrate processing units 128 in a collective manner.

For convenience, in FIG. 1, a lower side is referred to as a front side, and an upper side is referred to as a rear side. In the semiconductor manufacturing apparatus 100 of FIG. 1, an atmosphere-side block 101 is disposed on the front side, and a vacuum-side block 102 is disposed on the rear side. The atmosphere-side block 101 is a block in which the wafer W is transferred in a transfer chamber whose internal pressure is set to atmospheric pressure, and the wafer W is positioned for storage. On the other hand, the vacuum-side block 102 is a block which is connected adjacent to the rear side of the atmosphere-side block 101, in which the wafer W is transferred in a chamber that is decompressed to a predetermined degree of vacuum, is disposed in the processing chamber in a predetermined one among the substrate processing units 128, and is then processed. A region connecting the atmosphere-side block 101 and the vacuum-side block 102, in which atmospheric pressure and vacuum pressure can be adjusted in a state where the wafer W is held therein, is arranged between the atmosphere-side block 101 and the vacuum-side block 102.

The atmosphere-side block 101 is provided with an atmospheric transfer container 103 which is a substantially rectangular parallelepiped housing provided with an atmospheric transfer robot 105 for transferring the wafer W therein. On a front surface of the atmospheric transfer container 103, a plurality of cassette tables 104 (here, three cassette tables) each mounting a cassette containing the wafer W on an upper surface thereof are arranged.

A load port (not shown) is arranged above the upper surface of each cassette table 104 provided on the front surface of the atmospheric transfer container 103. The load ports can open and close openings through which the wafer W passes when the wafer W is held on a tip portion of the atmospheric transfer robot 105 and exchanged between an internal space inside the atmospheric transfer container 103 and the inside of the cassette. A front opening unified pod (FOUP) containing, for example, 25 wafers W is placed on the upper surface of each of the cassette tables 104.

The atmospheric transfer robot 105 disposed in the atmospheric transfer container 103 carries the wafer W into the atmospheric transfer chamber inside the atmospheric transfer container 103 from one of the FOUPs through the opening opened at the load port, and carries the wafer W into one of upper and lower lock chambers 107. Alternatively, the atmospheric transfer robot 105 carries out the wafer W from one of the lock chambers 107 and carries the wafer W into an original position in the original FOUP.

The vacuum-side block 102 includes the first vacuum transfer unit 112 and the second vacuum transfer unit 122 which have the vacuum containers having a substantially rectangular shape or square shape in a plan view, and the one or more lock chambers 107. The one or more lock chambers 107 are separate vacuum containers arranged between the first vacuum transfer unit 112 and the rear surface of the atmospheric transfer container 103 of the atmosphere-side block 101, and have a function of increasing or decreasing the internal pressure thereof between a value approximately close to atmospheric pressure and a decompressed value of a predetermined degree of vacuum while holding the wafer W inside.

Each of the lock chambers 107 has a container whose internal space can store a plurality of wafers W with a gap in an upper-lower direction. In addition, at front and rear end portions of each of the lock chambers 107, gates, which are passages through which the wafer is transferred through the inside thereof, are provided at positions connected to the atmospheric transfer container 103 and the first vacuum transfer unit 112.

A gate on the atmosphere side (atmospheric transfer container 103 side) is opened or closed by a gate valve 106 to be hermetically sealed, and a gate on the vacuum side (first vacuum transfer unit 112 side) is opened or closed by a gate valve 108 to be hermetically sealed. The atmosphere-side block and the vacuum-side block are hermetically isolated from each other by closing the gate valves 106 and 108.

In FIG. 1, only a single lock chamber 107 is shown in a plan view, but in the present embodiment, a plurality of lock chambers having dimensions that are the same or close to the same are stacked in the upper-lower direction. In addition, in the following description, unless otherwise specified, the plurality of lock chambers 107 will be described as a single lock chamber 107. As described above, the vacuum-side block 102 is a block that is a space in which containers capable of maintaining high vacuum pressure are connected to each other and the entire inside is maintained in a decompressed state.

The first vacuum transfer unit 112 and the second vacuum transfer unit 122 are units including vacuum transfer containers each having a substantially rectangular shape in a plan view (here, referring to housings surrounding the first vacuum transfer unit 112 and the second vacuum transfer unit 122, and the insides thereof are referred to as vacuum transfer chambers). These units are two units that have structural differences that can be regarded as substantially the same. Vacuum transfer robots 113 and 123 that transfer the wafer W are arranged inside these first and second vacuum transfer units. The vacuum transfer robots 113 and 123 are also collectively referred to as vacuum transfer robots.

Each of the vacuum transfer robots 113 and 123 is rotatable about an upper-lower axis disposed at a central portion in the transfer chamber inside the vacuum container, and includes an arm in which each two end portions of a plurality of arm portions extending in a beam shape are connected by a joint portion having an axis in the upper-lower direction. A robot arm capable of rotation, expansion, and contraction by rotation of each arm portion about the axis of each joint portion of the arm is constituted, and an end portion of the arm portion at a tip end is provided with a wand 113' or 123' whose tip end has a U shape in a plan view.

The vacuum transfer robot 113 and 123 have a function of positioning the wafer W by rotating and expanding the arm about the axis of the central portion so that the wafer W is located at a position opposed to a target such as the substrate processing units 128-1 to 128-4 or the lock chamber 107 in a state where the wafer W is held on the wands 113' and 123', and further carrying the wafer W to the target. Further, the vacuum transfer robots 113 and 123 have a function of carrying the wafers W out of the target, contracting the arm, and carrying the wafers W into the transfer chamber.

In the first vacuum transfer unit 112 of the present embodiment, left and right (left and right in FIG. 1) side wall surfaces of the vacuum transfer container are connected to the substrate processing units 128-1 and 128-2 arranged on outer sides of the vacuum transfer container via connection pipes 114 and 115, respectively. Each of the connection pipes 114 and 115 has therein a passage through which the wafer W is placed on the vacuum transfer robot 113 and transferred.

Further, inner end portions of the connection pipes 114 and 115 are communicated with the vacuum transfer chamber respectively through gates which are openings formed in the left and right side walls of the vacuum transfer container of the first vacuum transfer unit 112. The openings of the gates are opened or hermetically closed by gate valves 110 and 111 disposed inside the vacuum transfer container and moving in the upper-lower direction.

Further, in the first vacuum transfer unit 112, front and rear (upper and lower in FIG. 1) side wall surfaces of the vacuum transfer container are connected to the atmospheric transfer container 103 and the vacuum transport container of the second vacuum transport unit 122 which are arranged on the outside of the vacuum transfer container via the lock chamber 107 and a buffer chamber 118, respectively. Like the lock chamber 107, the buffer chamber 118 also has a storage space therein. The wafer W is mounted on the vacuum transfer robot 113 so as to be carried and stored in the storage space, or carried out from the storage space.

As in the case of the lock chamber 107, both end portions of the buffer chamber 118 in the front-rear direction communicate with the vacuum transfer chambers through gates, which are openings formed in side walls of a rear surface of the vacuum transfer container of the first vacuum transfer unit 112 and a front surface of the vacuum transfer container of the second vacuum transfer unit 122. Openings of the gates are opened or hermetically closed by gate valves 109 and 119 that are arranged inside the vacuum transfer containers and move in the upper-lower direction.

Similarly, in the second vacuum transfer unit 122 of the present embodiment, left and right (left and right in FIG. 1) side wall surfaces of the vacuum transfer container are connected to the substrate processing units 128-3 and 128-4 arranged on outer sides of the vacuum transfer container via connection pipes 124 and 125, respectively. Each of the connection pipes 124 and 125 has therein a passage through which the wafer W is transferred by the vacuum transfer robot 123.

Further, inner end portions of the connection pipes 124 and 125 are communicated with the vacuum transfer chamber respectively through the gates which are openings formed in the left and right side walls of the vacuum transfer container of the first vacuum transfer unit 122. The openings of the gates are opened or hermetically closed by gate valves 120 and 121 disposed inside the vacuum transfer container and moving in the upper-lower direction.

Further, in the second vacuum transfer unit 122, a front (upper in FIG. 1) side wall surface of the vacuum transfer container is connected to the vacuum transfer container of the first vacuum transfer unit 112 via the buffer chamber 118.

The buffer chamber 118 of the present embodiment is a single container having a substantially rectangular shape or square shape in a plan view, but may be configured such that a plurality of containers are stacked in the upper-lower direction, and the vacuum transfer robots 113 and 123 may carry the wafer W into and out of each. In addition, the gate valves 109, 110, 111, 119, 120, and 121 of the present embodiment are opened during operation of processing the wafer W by the substrate processing units 128-1 to 128-4 connected via the connection pipes 114, 115, 124, and 125 respectively corresponding to the gates that can open and close, so that the passages inside the corresponding connection pipes 114, 115, 124, and 125 are set to the same decompressed pressure as the inside of the vacuum transfer chamber.

On the other hand, the passages inside the connection pipes 114, 115, 124, and 125 communicate with the processing chambers inside the vacuum containers through the gates which are openings formed on the side walls of the vacuum containers of the substrate processing units 128-1 to 128-4 and through which the wafers W are transferred. In addition, process valves 116, 117, 126, and 127 that move up and down to open or hermetically close the respective gates of the substrate processing units 128 are provided at end portions of the connection pipes 114, 115, 124, and 125 on sides close to the substrate processing units 128.

As described above, in this example, the wafer W is carried in or out between each of the substrate processing units 128 and the first and second vacuum transfer units 112 and 122 in a state in which the plurality of gate valves and the plurality of process valves open the respective gates. In addition, the wafers W are carried in or out between the first vacuum transfer unit 112, the second vacuum transfer unit 122, and the lock chamber 107 or the buffer chamber 118 in a state in which the gate valves 108, 109, and 119 are open.

In addition, the buffer chamber 118 is configured similar to the arrangement of the lock chamber 107, in which two chambers are arranged at a position overlapping each other in the upper-lower direction. More specifically, the buffer chamber 118 is provided with a detachable partition plate (not shown) that partitions the inside of a vacuum container constituting a space for accommodating the wafer therein into upper and lower parts, which reduces movement of gas and particles between the two partitioned chambers.

That is, the buffer chamber 118 is a vacuum container whose inside can be decompressed to a degree of vacuum equivalent to that of another vacuum transfer chamber or vacuum processing chamber, and includes a storage section in which a plurality of wafers W are horizontally held in each chamber partitioned by the partition plate which is detachable while forming a gap between the surfaces of the plurality of wafers. As a result, when the wafers W are transferred between the first and second vacuum transfer units, a function of a so-called delivered relay chamber is exerted in which the wafers W are once carried in, stored, and then carried out.

That is, the buffer chamber 118 is a station for storing the wafers W to be processed or processed in any of the processing chambers of the plurality of substrate processing units 128. Therefore, there is a possibility that a wafer W processed in one of the processing chambers is carried into the storage space inside the buffer chamber 118 in a state in which an unprocessed wafer W scheduled to be processed in another one of these processing chambers is standing by in the storage space, or that an unprocessed wafer W scheduled to be processed in one of the processing chambers is transferred into the substrate processing units 128-3 and 128-4 in a state in which a wafer W processed by the substrate processing units 128-3 and 128-4 is waiting for transfer to any one of the lock chambers 107 in the storage space. By providing the storage space partitioned into the upper and lower parts as described above, even if an unprocessed wafer W and a processed wafer W are present in the buffer chamber 118 at the same time, gas or products remaining around the processed wafer W can be prevented from adversely affecting the unprocessed wafer W.

In addition, each of the gate valves 109, 110, 111, 119, 120, and 121 of the present embodiment has a performance of maintaining hermetical sealing such that a space on one side is approximately set to atmospheric pressure and a space on the other side has a pressure decompressed to a degree of vacuum equivalent to that during operation in a state where each of the gates is closed. On the other hand, the process valves 116, 117, 126, and 127 can be hermetically sealed by closing the gates for communicating between the decompressed passages of the wafers W of the connection pipes 114, 115, 124, and 125 in which the process valves are disposed, and the processing chamber decompressed to a degree of vacuum the same as or higher than that in the passages ahead in the vacuum containers of the substrate processing units 128.

As described above, in the substrate processing units 128 and the first vacuum transfer unit 112 or the second vacuum transfer unit 122 to which the substrate processing units 128 are connected, communication via the connection pipes 114, 115, 124, and 125 and the gates is secured by opening the corresponding gate valves 110, 111, 120, and 121 and the corresponding process valves 116, 117, 126, and 127, and the wafers W can be transferred to the substrate processing units 128 by the vacuum transfer robots 113 and 123. In addition, the connection pipes 114, 115, 124, and 125 and the gates are hermetically closed by closing the process valves.

The inside of the processing chamber inside the vacuum container of each of the substrate processing units 128 is maintained in a state of being decompressed to a predetermined degree of vacuum by operation of an exhaust device including a vacuum pump such as a turbo molecular pump, and a valve for adjusting a flow rate or a speed of exhaust, which are connected to the vacuum container, and processing such as etching using a plasma formed in the processing chamber, construction of film formation, and cleaning of the inside of the processing chamber is performed with respect to the wafers W disposed in the processing chamber.

Next, a configuration of any of the substrate processing units 128 of the semiconductor manufacturing apparatus 100 according to the present embodiment will be described with reference to FIG. 2. FIG. 2 is a vertical sectional view schematically showing an outline of a configuration of any of the substrate processing units of the semiconductor manufacturing apparatus according to the embodiment shown in FIG. 1.

The processing unit 200 shown in this figure includes, as a representative of the substrate processing units 128-1 to 128-4 shown in FIG. 1, for example, the substrate processing unit 128-1 and the first vacuum transfer unit 112 to which the substrate processing unit 128-1 is connected through the connection pipe 114. The substrate processing unit 128-1 includes a vacuum container 211, an electric field supply unit that is disposed above the vacuum container 211 and supplies an electric field or a magnetic field for forming a plasma inside the vacuum container 211, and an exhaust unit that is connected to a bottom surface of a lower portion of the vacuum container 211 and includes a vacuum pump that exhausts and decompresses the inside of the vacuum container.

The electric field supply unit arranged on an outer peripheral side of a cylindrical side wall of an upper portion of the vacuum container 211 having a cylindrical shape or above an upper lid portion includes an electric field generation power supply 207 that generates an electric field having a specific frequency of a microwave band as an electric field for forming a plasma in the processing chamber, a wave guide 206 through which the generated electric field propagates inside and is introduced into the processing chamber 201 in the lower vacuum container 211, and a solenoid coil 208 that forms a magnetic field around the outer periphery of the vacuum container 211.

In the substrate processing unit 128-1 of the present embodiment, molecules or atoms of a processing gas introduced into the processing chamber 201 are excited and ionized or dissociated by electron cyclotron resonance (ECR) in which an electric field and a magnetic field of a supplied microwave are generated by interaction to form a plasma, and a film to be processed on the upper surface of the wafers W disposed in the processing chamber 201 is etched using the plasma.

The upper portion of the vacuum container 211 is provided with a disk-shaped dielectric, for example, a dielectric window 204 made of quartz, which covers above the processing chamber 201 as an internal space in which the wafers W are disposed and the plasma is formed, and constitutes a lid portion of the vacuum container 211. A seal member such as an O-ring is interposed between an upper end portion of the cylindrical side wall of the upper portion of the vacuum container 211 and the dielectric window 204, and the inside of the processing chamber 201 and the outside in which an atmosphere has an atmospheric pressure are hermetically sealed.

A shower plate 205 made of a disk-shaped dielectric (for example, quartz) having a plurality of through holes through which the processing gas is introduced through the inside thereof is arranged above the processing chamber 201 below the dielectric window 204. The shower plate 205 is disposed in the decompressed processing chamber 201 and forms a ceiling surface of the processing chamber 201.

In the present embodiment, a cylindrical space having a diameter approximate to that of the dielectric window 204, and the wave guide 206 connected to the upper portion of the space are disposed above the dielectric window 204 disposed in the cylindrical upper portion of the vacuum container 211.

The wave guide 206 mainly includes two portions, one of which is a circular wave guide portion connected to the cylindrical space above the processing chamber 201, having a circular cross section, and having an axis extending vertically upward, and the other of which is a square wave guide portion whose one end portion is connected to the upper end portion of the circular wave guide portion, having an axis extending in a horizontal direction, and having a cross section that has a rectangular shape or square shape, or a similar shape.

The electric field generating power supply 207 such as a magnetron, which is formed by transmitting an electric field of a microwave, is disposed at the other end portion of the square wave guide portion. The electric field generated by oscillation of the electric field generating power supply 207 propagates through the wave guide 206, is introduced into a cylindrical space for resonance connected below the lower end portion of the circular wave guide portion, is set to a predetermined electric field mode inside, and is then supplied into the processing chamber 201 through the dielectric window 204.

Further, the solenoid coil 208 is disposed above the vacuum container 211 in a manner wound in a plurality of stages in the upper-lower direction so as to surround the periphery of the wave guide 206 and the periphery of the outer peripheral side wall of the upper portion of the vacuum container 211, and is capable of generating a magnetic field having an intensity corresponding to the frequency of the electric field of the microwave. The magnetic field formed by a direct current power supplied to the solenoid coil 208 generates ECR together with the electric field of the microwave introduced into the processing chamber 201 to excite particles of the processing gas introduced into the processing chamber, thereby forming the plasma in the processing chamber 201.

A sample stage 209 on which the wafer W is placed is arranged in the lower portion of the inside of the processing chamber 201. The sample stage 209 has a cylindrical shape, and a circular upper surface thereof is covered with a dielectric film which is a coating film formed by thermally spraying a material including a dielectric such as ceramics, and wafer W to be processed is placed on an upper surface of the dielectric film.

In a state in which the wafer W is adsorbed and held by the dielectric film, a gas having heat conductivity such as He is supplied to a gap between a rear surface of the wafer W and the upper surface of the dielectric film by an electrostatic force formed by the direct current power supplied to the electrode made of a conductor disposed inside the sample stage 209 or inside the dielectric film, and heat transfer between the sample stage 209 and the wafers W is promoted. In this state, the wafer W is processed (for example, subjected to plasma etching).

Further, a plurality of members are disposed inside the vacuum container 211 of the present embodiment and face the plasma. For example, a flange 210 is disposed above the sample stage 209 so as to surround the upper surface of the sample stage 209 in a ring shape. The flange 210 is formed of a conductive member, has a ring shape obtained by rotating an L-shaped cross section separated from a vertical axis around the vertical axis, and is disposed so as to cover the inner wall surface of the processing chamber 201 constituting the ceiling surface of the processing chamber 201 above the sample stage 209 with a gap therebetween. Further, in the flange 210, a base material whose surface is covered with aluminum oxide is electrically connected to a ground electrode.

The flange 210 is disposed as a part of the vacuum container 211 between a container in the upper portion and a container in the lower portion of the vacuum container 211 such that an inner peripheral side portion thereof including a ring-shaped inner peripheral edge portion faces the inside of the processing chamber 201. The upper portion of the vacuum container 211 is a cylindrical portion, which is the upper portion of the internal processing chamber 201 and surrounds a region where the plasma is formed inside. In addition, the lower portion of the vacuum container 211 is a container surrounding the lower portion of the processing chamber 201 with the flange 210 interposed therebetween, and is a member surrounding the periphery of the sample stage 209 with a gap therebetween.

The sample stage 209 is held at an intermediate height position between a top surface and a bottom surface of the vacuum container 211 in the upper-lower direction of the processing chamber 201 with gaps from these upper and lower surfaces. That is, the plasma is formed in a space of the processing chamber 201 between the upper surface and the top surface of the sample stage 209. In the space between the outer peripheral side wall of the sample stage 209 and the inner wall surface of the processing chamber 201 below the vacuum container 211 and the space between the lower surface of the sample stage 209 and the bottom surface of the vacuum container 211 are flow paths so that the plasma, the gas supplied into the processing chamber 201, or the particles of the product generated during the processing of the wafers W flow toward a circular exhaust port 214 disposed at the bottom portion of the vacuum container 211 and directly below the lower surface of the sample stage 209, and are discharged from the exhaust port 214 to the outside of the processing chamber 201 via the exhaust unit.

The exhaust unit of the present embodiment includes a plurality of vacuum pumps disposed on an upstream side and a downstream side in a flow direction of the exhaust gas, and a plurality of exhaust pipes connecting the exhaust port 214 and the vacuum pumps to communicate with each other. In the present embodiment, one of the exhaust pipes attached to the bottom portion of the vacuum container 211 connects the exhaust port 214 and an inlet of a turbo molecular pump 202 via an exhaust adjustment valve (not shown) that adjusts the amount and speed of internal exhaust gas by increasing or decreasing a flow path cross-sectional area of the exhaust gas.

Further, an outlet of the turbo molecular pump 202 is connected to an inlet of a dry pump 203 which is a roughing pump by another exhaust pipe, and gas or the like exhausted from the dry pump 203 is discharged through an exhaust path provided in a building such as a clean room in which the semiconductor manufacturing apparatus 100 is disposed. The turbo molecular pump 202 and the dry pump 203 constitute an exhaust pump.

In addition, a first vacuum transfer unit 112 is connected to the substrate processing unit 128-1 via the connection pipe 114. The first vacuum transfer unit 112 includes the gate valve 109 that opens and closes the gate that communicates the first vacuum transfer unit 112 and the vacuum transfer chamber 212 with the connection pipe 114 in the vacuum transfer chamber 212 inside the first vacuum transfer unit 112. The first vacuum transfer unit 112 is connected to the dry pump 213 via an exhaust port (not shown) communicating with the vacuum transfer chamber 212. By the operation of the dry pump 213, the vacuum transfer chamber 212 is exhausted and decompressed to a degree of vacuum slightly higher than the inside of the processing chamber 201.

While the wafer W is accommodated and processed in the processing chamber 201, the process valve 116 disposed in the connection pipe 114 closes the gate for communicating the processing chamber 201 disposed on the side wall on the lower portion of the vacuum container 211 with the inside portion of the connection pipe 114 to hermetically seal the processing chamber 201 and the connection pipe 114 from each other, and thus the difference in pressure is maintained.

On the other hand, when the wafer W is transferred between the inside of the processing chamber 201 and the vacuum transfer chamber 212, the process valve 116 is opened to communicate with the inside of the processing chamber 201 and the vacuum transfer chamber 212. As shown in FIG. 2, a driving unit 116d that drives the process valve 116 to move in the upper-lower direction is provided below the connection pipe 114. The driving unit 116d drives the process valve 116 to move into contact with a portion around the outer periphery of the gate formed on the side wall of the vacuum container 211, so as to hermetically seal a space communicating with the processing chamber 201 and the passage inside the connection pipe 114 from each other. One unit including the driving unit 116d and the connection pipe 114 is connected to the substrate processing unit 128-1 or the first vacuum transfer unit 112 as a connection unit.

In addition, a driving unit 109d that drives the gate valve 109 to move in the upper-lower direction is provided at a position below the vacuum container of the first vacuum transfer unit 112 and close to the connection pipe 114. The driving unit 109d drives the gate valve 109 to move into contact with a portion around the gate on the inner side wall of the vacuum container, so that the inside and the outside of the gate can be hermetically sealed from each other. The driving unit 109d also constitutes the first vacuum transfer unit 112.

Here, the flange 210 is disassembled together with the solenoid coil 208 and the upper portion of the processing chamber 201 at the time of maintenance or inspection of the inside of the processing chamber 201, and is opened and exposed to the atmosphere. Alternatively, when the coating film on the surface is degenerated or deteriorated, the flange 210 is removed and replaced. After the operation for the members inside the processing chamber 201 is completed, the upper portion of the processing chamber 201 is attached to the lower portion of the processing chamber 201 with the flange 210 interposed therebetween, thereby forming the vacuum container 211.

In addition, although the members disposed in the processing chamber 201 are swept and washed so as to clean the surfaces thereof, the members are exposed to the heat and the product generated during the decompression of the inside of the processing chamber 201 to a high degree of vacuum or during the processing of the wafers W, and thus particles and member fragments detached from the surface may adhere to the surface of the wafer W and generate objects.

In the present embodiment, in order to prevent the occurrence of the objects, the occurrence of the objects is predicted by using the number of attached particles and information of the attached portions on a transfer path of the wafer W to any one of the substrate processing units 128-1 to 128-4. Accordingly, when the generation of the objects is predicted, the processing of the wafer W is interrupted in any one of the substrate processing units 128-1 to 128-4 corresponding to the path, and the operation of maintenance and inspection such as cleaning of portions including portions assumed to be the object generation sources is started from the adhered portion.

That is, when unnecessary substances adhere to the wafer W from the surface of the processing chamber 201 and the objects are generated, a circuit structure of a semiconductor device on the surface of the wafer W may not be formed as desired. Therefore, when the objects are generated, the performance of the semiconductor device is impaired, a so-called failure occurs, and the yield of the semiconductor device is reduced. In order to prevent the generation of the objects so as to prevent such a decrease in yield, it is important to specify the portion of the generation source inside the semiconductor manufacturing apparatus, clean the portion or replace a member, thereby efficiently removing particles or fragments that cause the objects from the inside of the apparatus.

On the other hand, in a so-called concentrated region in which places or members assumed to be a generation source are present in a relatively narrow region or range, rapid identification of the portion to be cleaned or replaced leads to a reduction in the time other than the time required for the apparatus to process and mass-produce the semiconductor device, and is important for improving an operating rate of the semiconductor manufacturing apparatus. Therefore, in the present embodiment, when there are a plurality of portions that are assumed to be the object generation sources, the operation of efficiently and accurately detecting the portions of the generation sources is performed during maintenance or inspection. A method for detecting objects performed to perform the operation will be described with reference to FIGS. 3-7.

With reference to FIG. 3, a mode of maintenance or inspection in which the semiconductor manufacturing apparatus 100 of the present embodiment collects objects will be described. FIG. 3 is a horizontal sectional view schematically showing a state in which the objects are collected during maintenance or inspection performed on the semiconductor manufacturing apparatus shown in FIG. 1. In particular, FIG. 3 shows a cross section at a height position in the upper-lower direction of a line A-A shown in FIG. 2.

Here, after the previous maintenance or inspection operation performed on the substrate processing unit 128-1 is completed, a time when the number of wafers W processed in the processing chamber 201 of the processing unit reaches a predetermined value or a time during which the plasma is formed reaches a predetermined cumulative value in the processing chamber 201 is set as a next timing of maintenance or inspection.

When a control device (not shown) electrically connected to the semiconductor manufacturing apparatus 100 in a communicable manner detects that the timing of maintenance or inspection comes, the control device causes the semiconductor manufacturing apparatus 100 to switch an operation of the substrate processing unit 128-1 from a manufacturing operation of processing the wafers W to an operation of maintaining or inspecting the substrate processing unit 128-1 for mass production of the semiconductor device.

The maintenance or inspection operation is hereinafter referred to as a maintenance operation. In addition, before the start of the maintenance operation of the substrate processing unit 128-1, in response to a command signal from the control device, after the wafers W are processed in the processing unit, all the wafers W on the path from the processing chamber 201 to the lock chamber 107 are returned to the lock chamber 107 on a carry-out (return) path from the processing chamber 201 to an original FOUP on the cassette table 104 from which the wafers W are taken out.

When the maintenance operation is started, the control device of the semiconductor manufacturing apparatus 100 takes out test wafers W from the inside of a predetermined FOUP on the cassette table 104 and carries the test wafers W into the lock chamber 107. Further, the test wafers W are placed on the wand 113' at the tip portion of the arm of the vacuum transfer robot 113 controlled by the control device and taken out from the lock chamber 107 in which the pressure is reduced and the gate valve 108 is opened. As shown in FIG. 3, the taken out wafers W are inserted into the connection pipe 114 which is connected to the side wall of the first vacuum transfer unit 112 and the side wall of the vacuum container 211 of the substrate processing unit 128-1 and communicates between the vacuum transfer chamber 212 and the processing chamber 201 between the side walls.

Then, on an axial line (in the present embodiment, an axial line parallel to a straight line passing between a rotation axis along the upper-lower direction of the vacuum transfer robot 113 in the central portion of the vacuum transfer chamber 212 and the sample stage 209) in a direction of extension or contraction of the arm of the vacuum transfer robot 113 of the wafer W (left-right direction in the drawing), two outer peripheral edges of the wafer W in the axial direction, that is, an edge closest to the central portion of the upper surface of the sample stage 209 of the processing chamber 201 and an edge closest to the rotation axis of the vacuum transfer robot 113 of the vacuum transfer chamber 212 are located inside the processing chamber 201 and the vacuum transfer chamber 212, respectively, and in the plan view shown in FIG. 3, a projection surface of the wafer W is held for a predetermined time at a position where the projection surface of the wafer W overlaps the inside of each of the vacuum transfer chamber 212, the connection pipe 144, and the processing chamber 201.

Here, in a region in which a plurality of object generation sources are present within a range of a distance shorter than a diameter of the wafer W, an objects collecting process is performed in which the wafer W is disposed at a specific position for a predetermined time and objects falling at the position are attached to the wafer. In this process, in response to a command signal from the control device, the vacuum transfer robot 113 moves the wand 113' on which the wafer W is placed to the above-described position in a state where the gate valve 109 and the process valve 116 open the gates communicating with the inside of the connection pipe 114.

In the present embodiment, the members which are assumed to be the object generation sources are three members including a connection flange 301, an inner cover 302, and a connection flange 303 of the connection pipe 114 and the flange 210, and a total distance of the former three members is shorter than the diameter of the wafer W. Therefore, it is possible to dispose the wafer W at a position across the vacuum transfer chamber 212, the inside of the connection pipe 114, and the processing chamber 201. By arranging the wafer W at such a position and collecting the objects, it is possible to perform an accelerated test of objects detection of detecting from which of the connection flange 301, the inner cover 302, and the connection flange 303, or from which position particles or fragments are detached and floating, adhere to the surface of the wafer W, and the objects are generated.

The inner cover 302 is a pipe that is attached in a manner covering, and in contact with, an inner surface of a pipe line inside the connection pipe 114 having a substantially rectangular shape with rounded corners in a vertical section. A space inside the inner cover 302 serves as a passage between the gates through which the wafer W is transferred. The inner cover 302 is a cylindrical member constituted by a member made of aluminum or an alloy thereof, and a coating film made of a reactive gas used for processing the wafer W or ceramic particles such as aluminum oxide or yttrium oxide having low reactivity with highly reactive particles formed from the reactive gas is formed on an inner surface of the inner cover 302 by thermal spraying, etc.

The connection flanges 301 and 303 are disposed at end portions of the inner cover 302 inside the connection pipe 114 that are closer to the vacuum transfer chamber 212 and the processing chamber 201, respectively. These members each have a ring shape constituting an inner peripheral wall surface of the passage between the gates, and are in contact with the inner peripheral wall surface inside the connection pipe 114 and in contact with the vacuum transfer container of the first vacuum transfer unit 112 and the vacuum container 211 of the substrate processing unit 128-1, and constitute a cylindrical container coaxially and sequentially connected along an axis in a transfer direction of the wafer W.

In addition, the connection flanges 301 and 303 of the present embodiment constitute an end portion of the connection pipe 114 which is integrally formed with a part of a metal vacuum container constituting the connection pipe 114 and which is in contact with a side wall around the gate of the vacuum transfer container of the first vacuum transfer unit 112. A member capable of reducing reactivity is also disposed on the inner side surface constituting the inner peripheral wall surface of the passage between the gates of the connection pipes 114 of the connection flanges 301 and 303. For example, the connection flanges 301 and 303 may have a ceramic coating film covering the inner side surface, or the connection flanges 301 and 303 may be formed by firing a ceramic material.

The particles and fragments detached from a surface where these three members or two adjacent members of these three members are in contact with each other may fly and adhere to the wafer W held at the above position. It is presumed that the amount of adhesion is highly correlated with the number of substances that are object sources adhering to the surfaces of the members. Therefore, by inspecting the amount and composition of attached matters on the wafer W, it is possible to determine whether or not maintenance or inspection operation of the above three members is necessary.

FIG. 4 shows an example of gas flows in the wafer W and inside the processing chamber 201 and the vacuum transfer chamber 212 around the wafer W during detection of the objects. FIG. 4 is a vertical sectional view schematically showing the gas flows around the wafer in the object detection performed by the semiconductor manufacturing apparatus according to the embodiment shown in FIG. 1. In FIG. 4, the gas flows in the vacuum transfer chamber 212, the connection pipe 114, and the processing chamber 201 are schematically illustrated by arrows.

In the present embodiment, the inside of the vacuum transfer chamber 212 is exhausted by the dry pump 213, and the inside of the processing chamber 201 is exhausted by the turbo molecular pump 202 and the dry pump 203. Further, an inert gas (for example, nitrogen (N2) gas) is supplied to the inside of the vacuum transfer chamber 212, and an inert gas (for example, argon (Ar) gas) is supplied from the shower plate 205 to the inside of the processing chamber 201.

Since the amount or speed of exhaust inside the processing chamber 201 is larger than the amount or speed of exhaust inside the vacuum transfer chamber 212, the internal pressure of the processing chamber 201 becomes higher than the internal pressure of the vacuum transfer chamber 212, and a gas flow from the vacuum transfer chamber 212 toward the processing chamber 201 is generated in a gate through path of the connection pipe 114. Here, the gas flow in the connection pipe 114 is preferably an intermediate flow. Generally, an intermediate flow is a gas flow that satisfies $0.01 < Kn < 0.5$ where $Kn$ is a Knudsen number.

The wafer W held on the wand 113' is disposed below the inner wall surfaces of the connection flange 301, the inner cover 302, and the connection flange 303 that constitute the ceiling surface of the passage between the gates inside the connection pipe 114 in a manner separated by a distance L.

In the present embodiment, the pressure in the vacuum transfer chamber 212 is adjusted by adjusting the amount or speed of the supply of the nitrogen gas or the amount or speed of the exhaust by the connected dry pump 213 such that the flow of the nitrogen gas passing through a space between the wafer W and the connection pipe 114 toward the processing chamber 201 is diffused in a predetermined manner in the region of the intermediate flow.

The nitrogen gas in the vacuum transfer chamber 212 is sucked by the operation of the dry pump 213 connected to the bottom surface of the vacuum container of the first vacuum transfer unit 112, flows downward from a space above the arm of the vacuum transfer robot 113 in the vacuum transfer chamber 212, and passes through a space around the opening of the gate communicating with the passage in the connection pipe 114. At this time, a part of the nitrogen gas flows into the passage between the gates of the connection pipe 114, and the other part of the nitrogen gas flows downward around the wafer W and the wand 113' of the vacuum transfer robot 113 to flow into the space below the arm, and then is discharged to the outside of the vacuum transfer chamber 212 by the dry pump 213.

On the other hand, the argon gas supplied into the processing chamber 201 from a gas inlet of the shower plate 205 passes through a space around the sample stage 209 and between the inner side wall of the processing chamber 201 and the outer peripheral side wall of the sample stage 209, and flows into a space below the sample stage 209.

The part of the nitrogen gas flowing into the passage between the gates of the connection pipe 114 from the inside of the vacuum transfer chamber 212 flows into the processing chamber 201 through the opening of the gate facing the processing chamber 201, flows downward around the wafer W, the wand 113' of the vacuum transfer robot 113, and the sample stage 209 together with the argon gas, and flows into the lower portion of the processing chamber 201 below the sample stage 209. The gas flowing into the processing chamber 201 below the sample stage 209 is discharged to the outside of the processing chamber 201 through the exhaust port 214 by the operation of the turbo molecular pump 202 and the dry pump 203.

The nitrogen gas in the vacuum transfer chamber 212 of the present embodiment flows as an intermediate flow from the vacuum transfer chamber 212 into the passage between the gates in the connection pipe 114, and passes through the inside of the passage in the state of the intermediate flow. Thereby, intermolecular collision in the inside becomes dominant, and diffusivity of the nitrogen gas decreases as compared with a molecular flow in which collision with the wall is dominant. Therefore, the particles and fragments that are object sources detached from the inner surfaces of the three members diffuse while colliding with nitrogen molecules, and thus are assumed to have a diffusivity sufficiently smaller than the wafer diameter of 300 mm.

As a result, the particles and fragments as the objects detached from the inner side surfaces of the three members are prevented from diffusing beyond the size of the surface of the wafer W, and fall down from the upper side to the lower side and fall into a relatively small region of the wafer W. More preferably, the particles and the fragments adhere together in a state close to a vertical drop. Accordingly, when the objects attached to the surface of the wafer W are mapped, a correspondence relation with the object generation sources can be easily derived.

In addition, if the height between the surface of the wafer W and the ceiling surface of the passage between the gates is sufficiently large, the particles or fragments detached from the inner surfaces of the three members may not adhere to the upper surface of the wafer W and may flow into the processing chamber 201 of the substrate processing unit 128-1 before falling and adhering to the wafer W. Therefore, it is preferable that the distance L between the wafer W and the ceiling surface is set such that a sufficient number of particles or fragments can be obtained by collecting the objects.

FIG. 5 shows a state in which the particles or the like fall from above the wafer W. FIG. 5 is a vertical sectional view schematically showing a state of the particles or the like attached during detection of the objects shown in FIG. 4. FIG. 5 shows an example (model) in which, in a state where the wafer W is held at the position shown in FIG. 4, fine cracks or the like are generated in the inner peripheral wall surfaces of the connection flange 301, the inner cover 302, and the connection flange 303, whereby movement of the particles or the like generated by being detached from the inner peripheral wall surfaces is estimated.

In FIG. 5, reference numeral 501 denotes a collection of particles constituted by a plurality of particles generated by being detached from the surface of the connection flange 301 on the processing chamber 201 side. The particle group 501 adheres to a region close to the substrate processing unit 128-1 from the center of the surface of the wafer W. Reference numeral 502 denotes a collection of a plurality of particles generated from the surface of the inner cover 302. The particle group 502 adheres to a central portion of the surface of the wafer W. Reference numeral 503 denotes a collection of particles formed of a plurality of particles generated from the connection flange 303 on the vacuum transfer chamber 212 side. The particle group 503 adheres to a region close to the vacuum transfer chamber 212 from the center of the surface of the wafer W.

In addition, in the passage between the gates of the connection pipe 114, gas particles flow from the vacuum transfer chamber 212 toward the processing chamber 201. Therefore, the particle groups 501, 502, and 503 move toward the processing chamber 201 while falling after being detached, respectively. Therefore, the position to which the particles of each collection are attached is also a position moved from the detached position in a direction closer to the processing chamber 201 as a whole when viewed from above, and thus in a case of a test wafer W having a circular shape or a shape similar to a circular shape, the position at which the wafer W is held may be a position at which an area of the surface of the wafer W protruding from the opening of the gate of the processing chamber 201 into the processing chamber 201 is larger than an area protruding from the opening of the gate of the vacuum transfer chamber 212. In addition, the shape of the test wafer W is not limited to a circular shape, and may be, for example, a rectangular shape.

The method for detecting objects on the wafer W performed by the semiconductor manufacturing apparatus 100 of the present embodiment will be described with reference to FIG. 6. FIG. 6 is a flowchart showing a flow of a procedure of collecting and detecting the objects performed during a maintenance operation of the vacuum processing apparatus according to the embodiment shown in FIG. 1. Steps S601 to S607 constitute the objects collecting process, and step S608 and subsequent steps constitute an objects detecting process.

As shown in FIGS. 4 and 5, a process of detecting particles (objects) on the wafer W during the maintenance operation of the substrate processing unit 128-1 will be described. Further, the following operations are performed in response to a command signal from the above-described control device (not shown).

In FIG. 6, first, during the maintenance operation, in step S601, the control device operates the exhaust unit including the turbo molecular pump 202 of the substrate processing unit 128-1 to exhaust the inside of the processing chamber 201, thereby reducing the pressure to a predetermined degree of vacuum, particularly to a high vacuum degree (for example, about 9E-4 Pa) in this example. Similarly, in step S602, the control device drives the dry pump 203 to exhaust the inside of the vacuum transfer chamber 212 to reduce the pressure to a predetermined degree of vacuum, that is, a value within a range from a low vacuum to a medium vacuum (for example, about 1E-1 Pa). Steps S601 and S602 may be performed in parallel.

Next, in step S603, the control device introduces the nitrogen gas into the vacuum transfer chamber 212 while exhausting the inside of the vacuum transfer chamber 212, and adjusts the pressure of the nitrogen gas to a value within a predetermined range. In particular, here, the pressure is set to a pressure at which the flow of gas or particles in the passage between the gates during the objects collection is diffused as an intermediate flow. In addition, the introduced nitrogen gas continues to flow without being stopped during the objects collection.

Further, in step S604, the control device drives the transfer robot to take out the test wafer W from the inside of the FOUP and transfer the test wafer W from the atmosphere-side block 101 to the vacuum-side block 102. Specifically, the test wafer W is carried into the lock chamber 107 and then the inside of the lock chamber 107 is exhausted and is decompressed to the same pressure as the inside of the vacuum transfer chamber 212. In addition, the test wafer W is a wafer W using an unused Si substrate.

Next, in step S605, the control device opens the process valve 116 between the passage between the gates in the connection pipe 114 and the processing chamber 201. The gate valve 109 may be opened before the start of objects collection, or the process valve 116 may be opened in the steps after step S602 and before step S605 instead of step S605.

Next, in step S606, the control device drives the transfer robot to carry out the test wafer W from the lock chamber 107, passes the test wafer W through the vacuum transfer chamber 212, and transfers the test wafer W to a position (objects collection position) straddling each of the vacuum transfer chamber 212, the passage between the gates in the connection pipe 114, and the processing chamber 201 as shown in FIG. 3, and maintain the test wafer W at the position.

In the example of FIG. 3, below the ceiling surface of a cylindrical passage formed by the inner peripheral wall surfaces of the connection flange 301, the inner cover 302, and the connection flange 303 which are sequentially connected, the test wafer W is held at a predetermined distance from each member.

While this state is maintained, the test wafer W is held for a predetermined period in step S607. In addition, at this time, the nitrogen gas is continuously introduced into the vacuum transfer chamber 212, and the exhaustion of the vacuum transfer chamber 212 and the processing chamber 201 by the operations of the dry pump 213 and the turbo molecular pump 202 is continued.

Thereafter, in step S608, particles adhering to the surface of the test wafer W are detected. Specifically, first, the control device drives the transfer robot to carry out the test wafer W from the objects collection position and transfer the test wafer W to the original FOUP. The test wafer W is transferred from the FOUP to an objects detecting device disposed at a remote place in a state of being shielded from the outside, and analysis of the particles is performed by the objects detecting device.

In the objects detecting device, for example, components of substances constituting the particles and ratios (compositions) thereof are detected, the type and the number of particles are detected from components of specific substances or ratios thereof, and data in which different types and numbers of particles are associated with positions on the wafer W is created. The control device creates an object map based on the data, and transfers the object map from the objects detecting device to a storage device such as a hard disk that is communicably connected, so that the object map is stored.

An example of such an objects detecting device will be described with reference to FIG. 7. FIG. 7 is a plan view schematically showing an outline of the objects detecting device for detecting the objects on the surface of the wafer W used for detecting the objects in the embodiment shown in FIG. 6.

In an objects detecting device 700 for detecting the objects on the surface of the wafer W shown in FIG. 7, the test wafer W returned to the FOUP after the particles are attached for a predetermined period in step S608 of FIG. 6 is further transferred to the objects detecting device 700 and mounted on a loader 701 in FIG. 7.

Thereafter, the test wafer W is taken out from the loader 701 by a handling arm 702 and transferred to a pre-aligner 703. After a notch (alignment marker) of the test wafer W is detected and the alignment is adjusted by a rotary table 704 of the pre-aligner 703, the wafer W is transferred to a detection position 705 and the particles are detected.

That is, the position at which the particles adhere to the test wafer W, the type, and the number of particles (here, the number of particles for each particle type counted by a counter inside the objects detecting device 700) are calculated as data. For example, with respect to the wafer W shown in FIG. 3, each of the regions projected onto the upper surface of the wafer W of the connection flange 301, the inner cover 302 when viewed from above, and the connection flange 302 is assumed to be an attachment region of the particles detached from each of the connection flange 301, the inner cover 302, and the connection flange 302, and these attachment assumed regions are partitioned as regions on the wafer W on coordinate data.

The coordinate data of these regions is input as information from an input device (not shown) to the objects detecting device 700, and the number of particles adhering to a range of each assumed region partitioned on the wafer W is calculated by the objects detecting device 700 from the coordinates of each particle in the data of the recorded object map, and is displayed on a display device (not shown) of the objects detecting device 700. Alternatively, the calculated number of particles for each region may be transmitted as data to the semiconductor manufacturing apparatus 100 via a communication means.

After the detection of the objects is completed in step S608 of FIG. 6, in the next step S609, the control device analyzes mapping of the objects based on the type and the number of particles attached to the assumed regions of the wafer W. Further, the control device detects the types of particles for each region and the number of particles for each type, and compares the number of particles from each of the connection flange 301, the inner cover 302, and the connection flange 303 with an upper limit value of a predetermined allowable range in step S610 based on the type of particles and the number of particles for each type. By this comparison, the presence or absence of particle generation as the object source and the position thereof are specified.

As a result of the comparison, when the number of particles generated from any one of the connection flange 301, the inner cover 302, and the connection flange 303 exceeds the upper limit value and thus it is determined that the objects are out of the allowable range, it is notified on a display (not shown) of the semiconductor manufacturing apparatus 100 that replacement or cleaning (maintenance operation) of the members is necessary. On the other hand, when it is determined that the objects are within the allowable range, it is notified on the display that the maintenance operation is not necessary.

The determination and the notification may be directly performed by the objects detecting device 700 without using the control device. In this case, the maintenance operation is shifted to a maintenance operation mode for replacing or cleaning the members after the completion of a particle analysis process, and the pressure inside the connection pipe 114 or the first vacuum transfer unit 112 is increased to a pressure equal to the atmospheric pressure. Thereafter, at least an upper lid member is removed, the so-called atmosphere is opened, and the three members are removed from the connection pipe 114 or the first vacuum transfer unit 112 and cleaned.

On the other hand, when the number of particles generated from any one of the connection flange 301, the inner cover 302, and the connection flange 303 is less than the upper limit value, and it is determined that the objects are within the allowable range, the control device determines that a mass production operation for manufacturing the semiconductor device to be performed next can be continuously performed, and the operation of the semiconductor manufacturing apparatus 100 is shifted to a preparation operation for the mass production operation. The result of such determination is also notified on the display (not shown) of the semiconductor manufacturing apparatus 100. Thus, the maintenance operation is completed.

The above-described maintenance operation is performed when the control device determines that the number of processed wafers W or the cumulative value of the time during which the plasma is formed reaches a predetermined value. Without being limited thereto, when the semiconductor manufacturing apparatus 100 is assembled, for example, when the semiconductor manufacturing apparatus 100 is assembled in a manufacturing factory, or when the semiconductor manufacturing apparatus 100 is first introduced and assembled in a place where it is installed for the mass production process such as clean rooms, or when a part of units constituting the semiconductor manufacturing apparatus 100 such as at least one of the substrate processing units 128, the first vacuum transfer unit 112, and the second vacuum transfer unit 122 is replaced or newly added, object detecting operation similar to the case of the above maintenance operation may be performed.

According to the present embodiment, in a region where a portion where a plurality of members are connected to each other is located at a distance shorter than the diameter of the wafer W, such as in a case where any of the substrate processing units 128 and the vacuum transfer chamber 212 are connected to each other by the connection pipe 114, the particles may be detected with the wafer W transferred to a position where the upper surface of the wafer W straddles portions where the members are connected to each other. By analyzing a detection result including the region and the number of particles attached to the wafer W, it is possible to determine from which member or from which connection portion the attached amount of particles or the like is out of the allowable range. According to a determination result, it can be determined that assembly is good or products can be shipped if the attached amount is within the allowable range, so that the semiconductor manufacturing apparatus 100 can be inspected as a product.

According to the embodiment described above, it is possible to accurately determine whether or not maintenance operation such as cleaning or replacing the members inside the semiconductor manufacturing apparatus 100 is necessary. Therefore, the occurrence of objects on the wafer W and an adverse effect of the objects on the processing are reduced, and the yield of the processing of the semiconductor manufacturing apparatus 100 is improved. In addition, the time required for the maintenance operation is shortened, time other than the operation in which the semiconductor manufacturing apparatus 100 processes the wafer W to mass-produce the semiconductor devices, that is, downtime, is shortened, and operation efficiency of the apparatus is improved.

REFERENCE SIGN LIST 100 semiconductor manufacturing apparatus (vacuum processing apparatus)
101 atmosphere-side block
102 vacuum-side block
103 atmospheric transfer container
104 cassette table
105 atmospheric transfer robot
106, 108, 109, 110, 111, 119, 120, 121 gate valve
107 lock chamber
116, 117, 126, 127 process valve
112 first vacuum transfer unit
113 vacuum transfer robot
114, 115, 124, 125 connection pipe
118 buffer chamber
122 second vacuum transfer unit
123 vacuum transfer robot
128, 128-1, 128-2, 128-3, 128-4 substrate processing unit
201 processing chamber
202 turbo molecular pump
203 dry pump
204 dielectric window
205 shower plate
206 wave guide
207 electric field generation power supply
208 solenoid coil
209 sample stage
210 flange
211 vacuum container
212 dry pump
301 connection flange
302 inner cover
303 vacuum container

The invention claimed is:

1. An objects detecting method for a vacuum processing apparatus equipped with a processing unit including a vacuum container having therein a processing chamber in which a wafer is processed, and an exhaust pump that exhausts gas in the processing chamber; a vacuum transfer unit including a vacuum transfer container having therein a transfer chamber in which the wafer is transferred; a connection pipe connecting the vacuum container and the vacuum transfer container therebetween; and a passage communicating between the processing chamber and the transfer chamber via an inside of the connection pipe and one or more flanges through which the wafer can be transferred between the processing chamber and the transfer chamber, an inner surface of the passage being constituted by a plurality of surface regions corresponding to a plurality of members constituting the passage comprising the connection pipe and the one or more flanges, the objects detecting method for a vacuum processing apparatus comprising:

an objects collecting process of increasing an internal pressure of the transfer chamber to be higher than an internal pressure of the processing chamber to generate a gas flow in the passage along a direction from the transfer chamber toward the processing chamber, transferring the wafer in the gas flow along the direction to a position where a projection surface of the wafer overlaps simultaneously an inside of each of the transfer chamber and the passage and the processing chamber, and stopping the transfer at the position while holding the wafer at the position for a predetermined time and, while the transfer is stopped, collecting the objects which fall to adhere to a surface of the wafer position where the projection surface of the wafer overlaps simultaneously the inside of each of the transfer chamber and the passage and the processing chamber; and an objects detecting process of detecting objects adhering to each of a plurality of regions of the surface of the wafer, each region of the surface of the wafer being associated with a different corresponding one of the plurality of the surface regions of the inner surface of the plurality of members constituting the passage comprising the connection pipe and the one or more flanges, and determining whether the result of the detecting objects is within an allowable range for each region.

2. The objects detecting method for a vacuum processing apparatus according to claim 1, wherein
in the objects collecting process, a gas is supplied into the transfer chamber, and
supply or exhaust of the gas into the transfer chamber is adjusted such that the gas flow supplied into the transfer chamber becomes an intermediate flow at the position where the projection surface of the wafer overlaps simultaneously an inside of each of the transfer chamber, and the passage, and the processing chamber.

3. The objects detecting method for a vacuum processing apparatus according to claim 2, wherein
when the plurality of members disposed in the connection pipe between the transfer chamber and the processing chamber are projected in an upper-lower direction, the plurality of projected members overlap at least a part of an upper surface of the wafer at the position where the projection surface of the wafer overlaps simultaneously an inside of each of the transfer chamber, and the passage, and the processing chamber.

4. The objects detecting method for a vacuum processing apparatus according to claim 3, wherein
in the objects collecting process, objects falling from each of the plurality of members are collected by adhering the objects to the wafer, and
in the objects detecting process, the number of the collected objects is detected, and whether or not maintenance operation for the plurality of members is necessary is determined based on the number of the detected objects.

5. The objects detecting method for a vacuum processing apparatus according to claim 1, wherein the objects collecting process and the objects detecting process are executed when the number of wafers processed by the processing unit or a cumulative value of time exceeds a predetermined value.

* * * * *